United States Patent
Lei et al.

(10) Patent No.: US 7,983,374 B2
(45) Date of Patent: Jul. 19, 2011

(54) METHODS AND SYSTEMS FOR PROVIDING VARIABLE CLOCK RATES AND DATA RATES FOR A SERDES

(75) Inventors: Leon Lei, Shanghai (CN); Han Bi, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 963 days.

(21) Appl. No.: 11/904,875

(22) Filed: Sep. 28, 2007

(65) Prior Publication Data

US 2009/0086847 A1 Apr. 2, 2009

(51) Int. Cl.
*H04L 7/00* (2006.01)
*H06G 1/12* (2006.01)
(52) U.S. Cl. ......... 375/371; 713/400; 713/503; 713/600
(58) Field of Classification Search .................. 375/226, 375/326, 354, 371, 373; 370/503, 516; 702/69; 713/400, 500, 501, 503, 600
See application file for complete search history.

(56) References Cited

U.S. PATENT DOCUMENTS

| 4,330,862 A * | 5/1982 | Smolik ............. 375/316 |
| 6,509,851 B1 * | 1/2003 | Clark et al. ............ 341/100 |
| 2004/0218634 A1 * | 11/2004 | Peng et al. ............ 370/503 |
| 2005/0180536 A1 * | 8/2005 | Payne et al. ............ 375/354 |

OTHER PUBLICATIONS

IEEE Standard for Information technology—Telecommunications and information exchange between systems—Local and metropolitan area networks—Specific requirements, Part 3: Carrier sense multiple access with Collision Detection (CSMA/CD) Access Method and Physical Layer Specifications, IEEE Computer Society, IEEE Std. 8023™, Dec. 26, 2008, 671 pages.

* cited by examiner

*Primary Examiner* — Young T. Tse
(74) *Attorney, Agent, or Firm* — Hayes and Boone

(57) ABSTRACT

A method and apparatus for varying an output clock signal frequency to match the frequency of an output data signal frequency for a SERDES circuit while maintaining a constant input clock frequency is shown. According to this method and apparatus, a PMA rate signal may control the frequency of the output clock while a datastrobe signal may be used to control the frequency of the data signal. Accordingly, the apparatus and methods may be used to produce an output data signal and a clock signal having frequencies that may be lower than the frequency of the input clock signal.

13 Claims, 8 Drawing Sheets

METHODS AND SYSTEMS FOR PROVIDING VARIABLE CLOCK RATES AND DATA RATES FOR A SERDES

FIELD OF THE INVENTION

The present invention relates to integrated circuits and, in particular, to providing variable data and clock rates for integrated circuits.

DISCUSSION OF RELATED ART

Modern networking systems allow users to obtain information from multiple data sources. These data sources may include, for example, publicly accessible web pages on the Internet as well as privately maintained and controlled databases. Users may access data from the data sources by entering certain identifying information. For example, a user on the Internet may access data on a website by entering the domain name of the website, where the domain name serves as the identifying information. Similarly, a user of a corporate database may access personnel data about a company employee by entering the last name of the employee, where the last name serves as identifying information. In some instances, a network search engine ("NSE") of a router or switch may facilitate the process of looking-up the location of the requested data.

FIG. 1a shows an exemplary embodiment of a router with an NSE. The router may receive communications from a network via network interface 101 and provide this information to a first integrated circuit ("IC"), such as application-specific IC ("ASIC") 102. ASIC 102 may then pass the identifying information to NSE 103 to determine the location in memory 104 of the requested data. After determining the location of the data, NSE 103 may request that memory 104 provide the requested data to ASIC 102 while also informing ASIC 102 that the requested data is being sent by memory 104. In many networking systems, NSE 103, which may also be implemented using an IC, is mounted to the same printed circuit board ("PCB") as ASIC 102 with the traces of the PCB connecting the two components. Although some networking systems may substitute a network processing unit ("NPU") or a field programmable gate array ("FPGA") for ASIC 102 in this description, the roles of the respective components remain the same. Thus, in some networking systems, the NPU or FPGA may accept communications from the network and provide the identifying information to NSE 103, which may facilitate delivering the requested data to the NPU or FPGA.

In some networking systems, communication between NSE 103 and ASIC 102 occurs using a parallel bus architecture on a printed circuit board. Initially, bi-directional parallel buses were used in which an IC used the same pins to both send and receive information. As data rates between NSE 103 and ASIC 102 increased, however, networking systems began to be implemented using uni-directional parallel buses in which the components used each pin to either send or receive data, but not both. To accommodate the amount of data being transmitted between ASIC 102 and NSE 103, some current networking systems use an 80-bit bus on the PCB to connect ASIC 102 and NSE 103.

Issues have arisen, however, with the parallel bus architecture used to connect ASIC 102 and NSE 103. For example, using a large bus complicates the design and layout process of the PCB. Additionally, increased processing and communication speeds have exposed other limitations with the parallel bus architecture. For example, the data transmitted by a parallel bus should be synchronized, but as communication speeds have increased, the ability to synchronize data transmitted on a parallel bus has become increasingly more difficult. Additionally, ground-bounce may occur when large numbers of data lines in a parallel bus switch from a logical one to a logical zero. Moreover, a parallel bus may consume a large number of pins on ASIC 102 and NSE 103. Further, a parallel bus may require NSE 103 to be placed very close to the ASIC. But because both ASIC 102 and NSE 103 may be large, complex ICs, thermal dissipation issues may result in hot spots occurring, possibly complicating the proper cooling of the components on the PCB. A wide, high-speed parallel bus may also make supporting NSEs on plug-in modules difficult or impossible.

In response to the issues posed by using a large parallel bus, some networking devices connect ASIC 102 and NSE 103 with a serial bus. In this configuration, the networking device may use a serializer-deserializer ("SERDES") to allow one or both of ASIC 102 and NSE 103 to continue to use a parallel interface to communicate with over the serial bus. For example, when ASIC 102 communicates with NSE 103, a SERDES may convert the parallel output from ASIC 102 to a serial data stream to be transmitted to NSE 103 over a serial data bus. Another SERDES may receive this serial transmission and convert it to a parallel data stream to be processed by NSE 103. As a result, instead of transmitting data over an 80-bit parallel bus at 250 MHz Double Data Rate (40 Gbps), networking devices may transmit data over 8 serial lanes operating at 5 Gbps.

Despite this increase in data transmission rates as compared to systems using a parallel bus architecture, increasing data transmission rates may require developers of networking devices to seek additional methods for reducing the complexity of data transmission and increasing the transmission rates between ASIC 102 and NSE 103. Accordingly, developers may increase the data transmission rates of a SERDES by increasing the input clock frequency with each new generation of SERDES. For example, while one generation may have an input clock frequency of $$\frac{1}{2T},$$

the next generation of SERDES may have an input clock frequency of 1/T.

FIG. 2 shows a timing diagram of data being input into a SERDES, such as SERDES 152 or 160, operating at a first frequency. Timing diagram 200 displays signals for input clock 205, input data 207, output data 210, and output clock 212. The data corresponding to input signal 207 may be input at interface 152a of SERDES 152. As shown in this exemplary diagram, input clock 205 and output clock 212 may have periods 215 of 2T seconds long, with a corresponding frequency of $$\frac{1}{2T}$$

Hz. Input clock 205 and input data 207 may be received from a device coupled to the SERDES. For example, device 105 may transmit signals for input clock 205 and input data 207 to SERDES 152 as shown in FIG. 1c. Similarly, output data 210 and output clock 212 may be output to a device coupled to the SERDES. For example, SERDES 152 may transmit signals for output data 210 and output clock 212 to SERDES 160, as shown in FIG. 1c.

FIG. 3 shows a timing diagram of data being input into another SERDES operating at a second frequency. Timing diagram 300 displays signals for input clock 305, input data 307, output data 310, and output clock 312. The data corresponding to input data signal 307 may be input at interface 152a of SERDES 152. Output data signal 310 may be input into a SERDES circuit. For example, output data signal may be data in a serial format when put into SERDES 152, which may transform it for output onto parallel data lines 150. Accordingly, input data 307 and output data 310 may represent serial data to be input into SERDES 152 via interface 152a. As shown in timing diagram 300, input clock signal 305 and output clock signal 312 may have the same periods 315 of T seconds, and a corresponding frequency of 1/T Hz. Accordingly, input clock signal 305 may have a frequency that is double the frequency of input clock signal 205, and output clock signal 312 may likewise have a frequency that is double the frequency of output clock signal 212. Input clock signal 305 and input data signal 307 may be received from a device coupled to the SERDES. For example, device 105 may transmit signals 305 and 307 for the input clock and input data, respectively, to SERDES 152 shown in FIG. 1c. Similarly, output data signal 310 and output clock signal 312 may be output to a device coupled to the SERDES. For example, SERDES 152 may transmit output data signal 310 and output clock signal 312 to SERDES 160, as shown in FIG. 1c.

The SERDES of timing diagram 300 may be one or more generations advanced from the SERDES of timing diagram 200. In some embodiments, a SERDES that is one or more generations advanced over another SERDES may have a clock speed that is faster than the other SERDES. As an example, the SERDES of timing diagram 300 may have a clock speed that is double the clock speed of the SERDES of timing diagram 200.

Some customers may wish, however, to maintain the data transmission rate of the older generation of SERDES even though the input clock frequency has been increased. Some customers, by contrast, may wish to transmit their data signal at a rate that matches the increased frequency of the input clock signal. Thus, there is a demand for a SERDES circuit that will accommodate transmission of data at a variable data rate even though the input clock speed remains constant.

SUMMARY

In accordance with described embodiments, apparatuses, systems, and methods for providing variable data and clock rates for integrated circuits.

In some embodiments, a circuit for providing a variable data transmission rate, the circuit may comprise a clock module having as inputs a data strobe signal, an input clock signal, and an input physical medium attachment ("PMA") rate signal, and a data module having as inputs the data strobe signal, the input clock signal, and an input SERDES data signal, the clock module outputting an output clock signal, the output clock signal have a first frequency when the PMA rate signal is set high and second frequency when the PMA rate signal is set low, and the data module outputting an output SERDES data signal as a function of the data strobe signal.

In some embodiments, the data module may include a data module multiplexer coupled to a data module flip flop, the data module multiplexer accepting as inputs the data strobe signal and the input SERDES data signal, and outputting an intermediate data signal as a function of the data strobe signal, the data module flip flop accepting as inputs the intermediate data signal and the input clock signal, and outputting the output SERDES data signal.

In some embodiments, the output SERDES data signal may change on a rising edge of the input clock signal when the data strobe signal is high.

The clock module may include a first clock module multiplexer, a clock module flip flop, and a second clock module multiplexer, wherein the first clock module multiplexer is coupled to the clock module flip flop, wherein the clock module flip flop is coupled to the second clock module multiplexer and the first clock module multiplexer, and wherein the second clock module multiplexer outputs the output clock signal. In some embodiments, the second clock module multiplexer may accept as an input the PMA rate signal and outputs the output clock signal as a function of the PMA rate signal. The circuit may be implemented as part of a SERDES circuit.

In some embodiments, a method for providing a variable data transmission rate may include inputting a data strobe signal, an input clock signal, and an input PMA rate signal to a clock module, inputting the data strobe signal, the input clock signal, and an input SERDES data signal to a data module, outputting an output clock signal from the clock module, the output clock signal having a first frequency when the PMA rate signal is set high and a second frequency when the PMA rate signal is set low, and outputting an output SERDES data signal from the data module as a function of the data strobe signal.

The method may include inputting the data strobe signal, the input clock signal, and an input SERDES data signal to a data module further includes inputting the data strobe signal and the SERDES signal to a data module multiplexer in the data module, outputting an intermediate data signal from the data module multiplexer, inputting the intermediate data signal and the input clock signal to a data module flip flop, and outputting the output SERDES data signal from the data module flip flop.

DETAILED DESCRIPTION

Figure 1A:
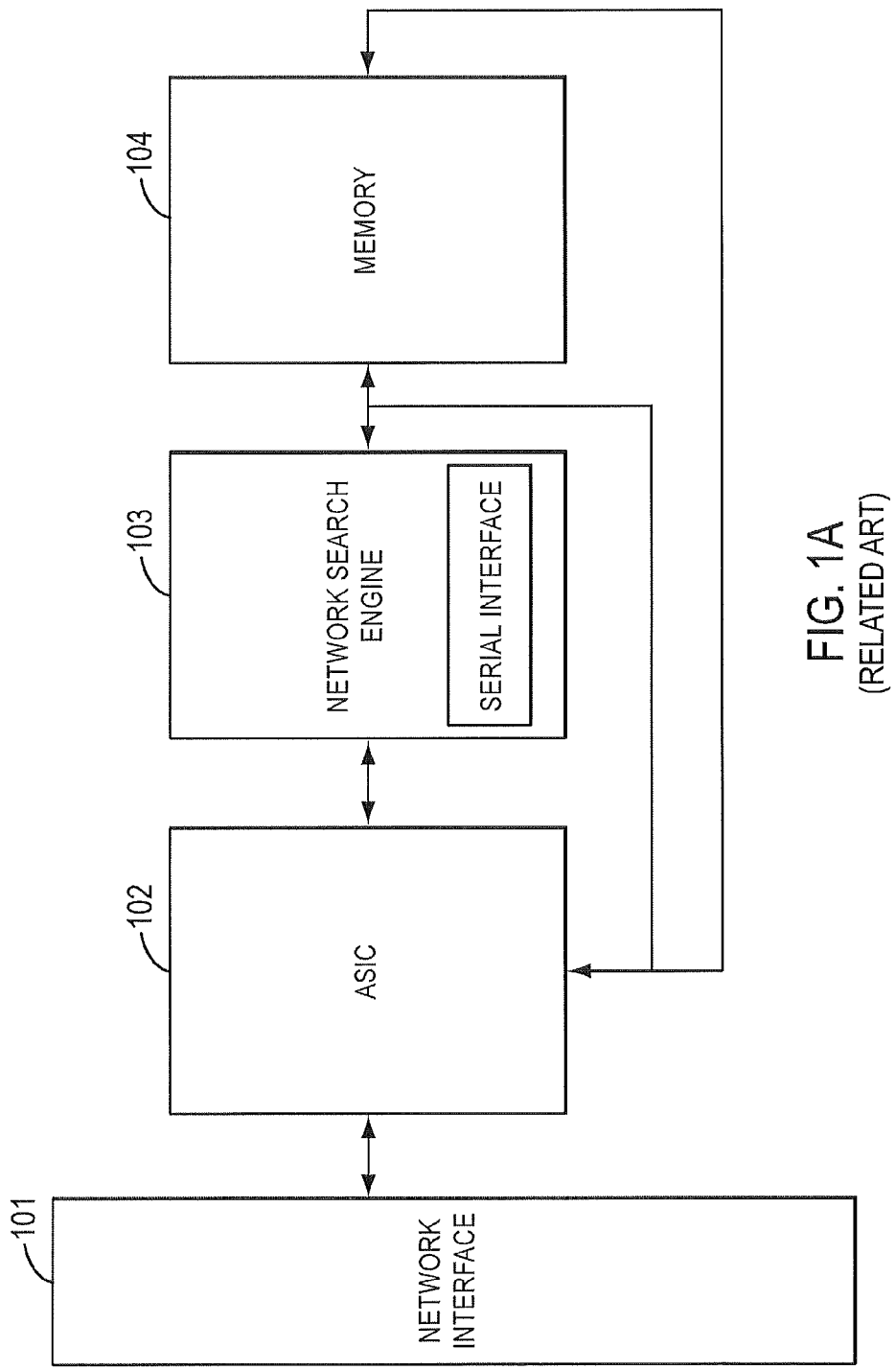
FIG. 1a shows an exemplary system of a router with a network search engine.
Figure 1B:
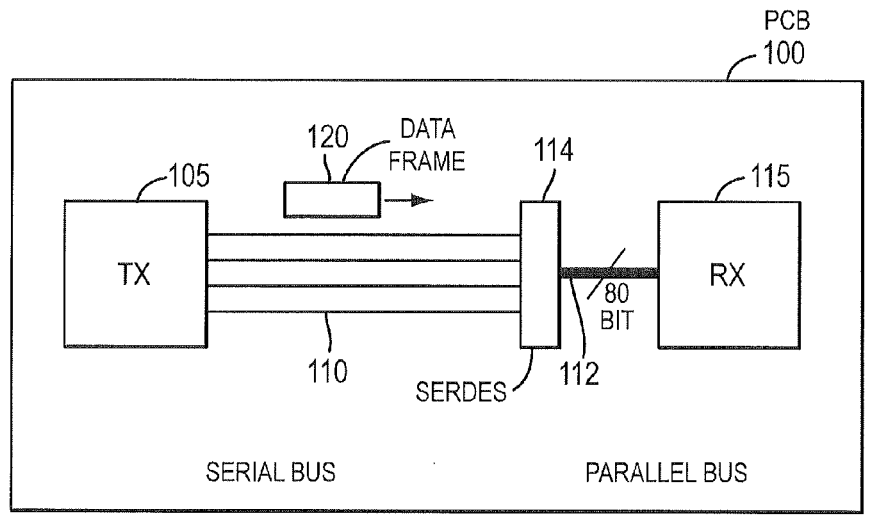
FIG. 1b shows a diagram of a circuit utilizing a SERDES according to some embodiments of the present invention.

FIG. 1b shows an exemplary block diagram of a circuit utilizing an embodiment of the present invention. As shown in FIG. 1b, transmitting component 105 may be sending data frame 120 over serial bus 110 to receiving component 115, where both transmitting component 105 and receiving component 115 are mounted on PCB 100. SERDES 114 may convert the serial data sent by transmitting component 105 so that it may be transmitted over parallel bus 112 and received by receiving component 115 using a parallel interface. In some embodiments, the parallel interface may correspond to physical pins on receiving component 115. SERDES 114 may be a SERDES circuit according to some embodiments of the present invention.

Figure 1C:
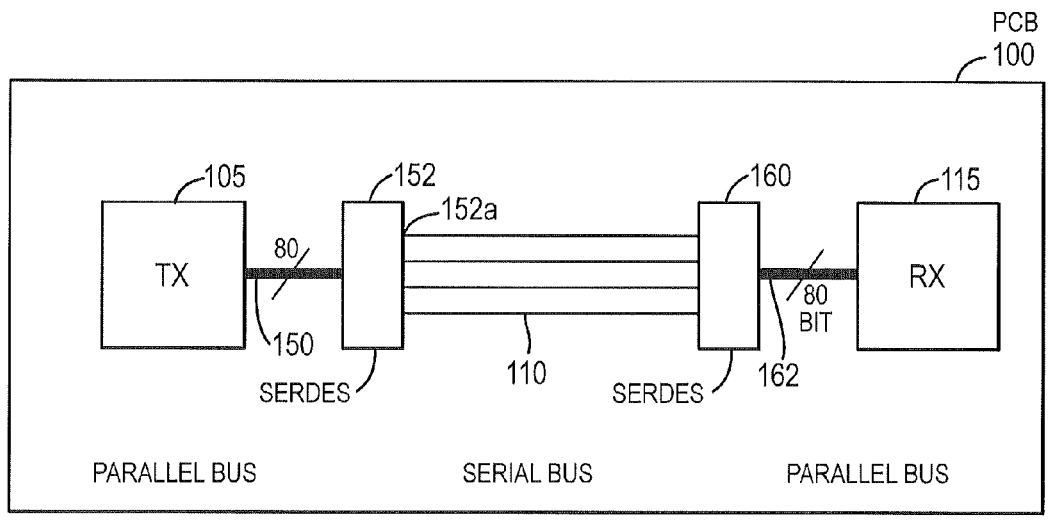
FIG. 1c shows a block diagram of another circuit capable of utilizing embodiments of the present invention.
Figure 2:
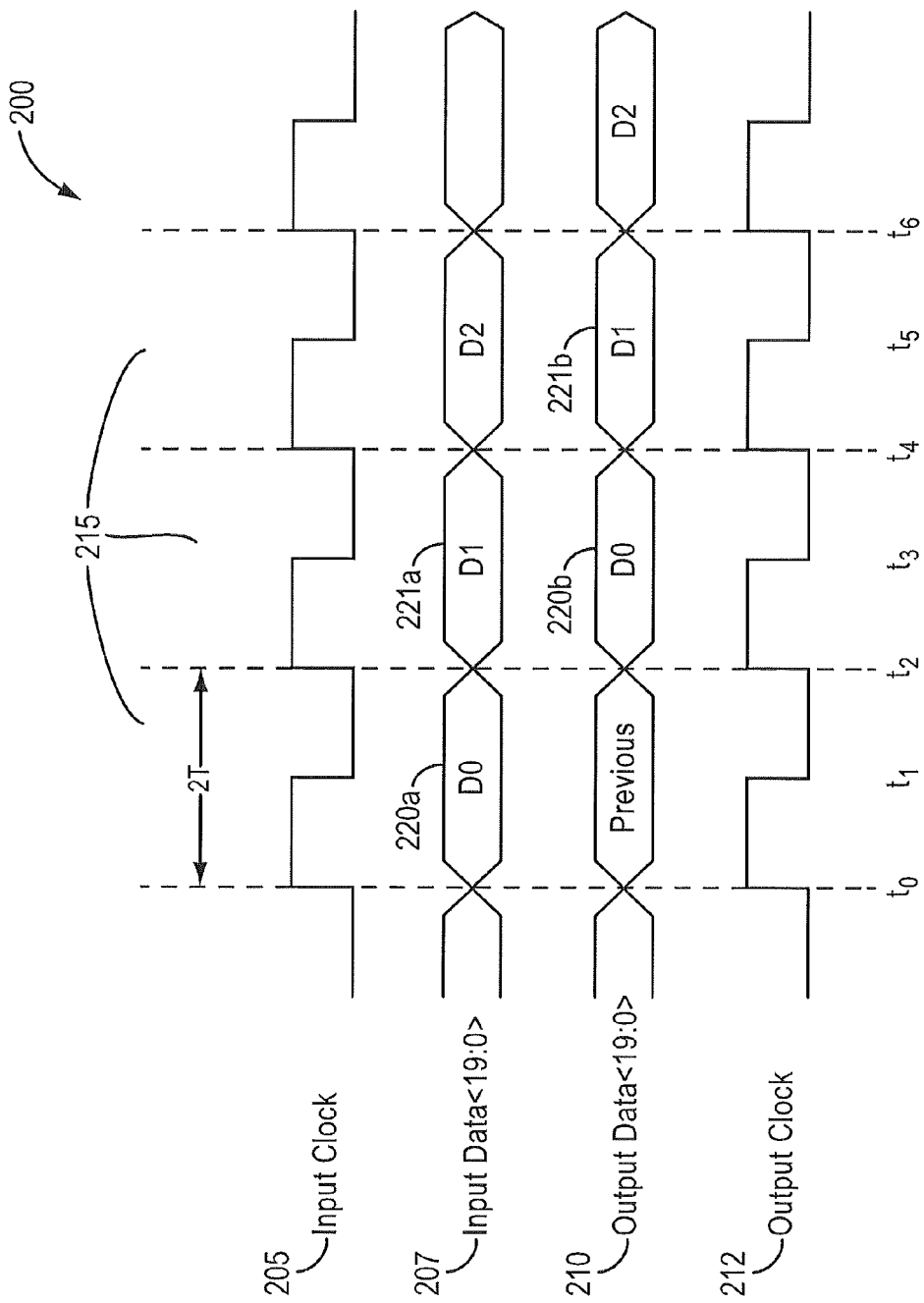
FIG. 2 shows a timing diagram of a SERDES operating at a first frequency.
Figure 3:
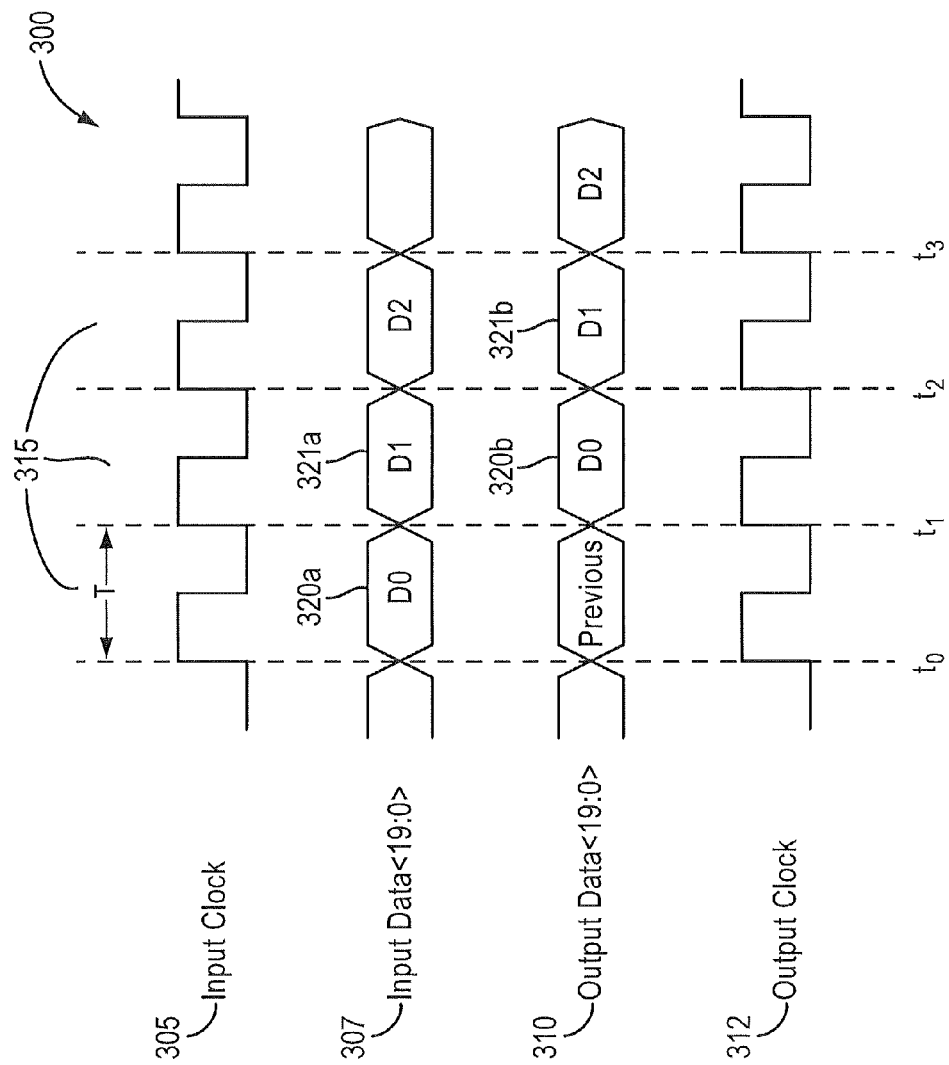
FIG. 3 shows a timing diagram of a SERDES operating at a second frequency.

FIG. 1c shows another block diagram of a circuit capable of utilizing a SERDES circuit according to some embodiments of the present invention. In FIG. 1c, transmitting component 105 may send data over parallel bus 150 to SERDES 152 which converts the parallel data to serial data which is then transmitted over serial bus 110 to SERDES 160. SERDES 160 accepts the serial data and transforms it into parallel data to be transmitted over parallel bus 162 to receiving component 115. In the exemplary embodiment, components 105 and 115 may be mounted on printed circuit board 100. Many of the SERDES applications shown in this disclosure are utilized on a single PCB. However, one skilled in the art will recognize that SERDES circuits that include embodiments of the present invention can be utilized in many other ways, including, but not limited to, board-to-board communications and component-to-component communications. SERDES circuits according to embodiments of the present invention can be utilized in any application where a SERDES circuit would normally be used.

Figure 4A:
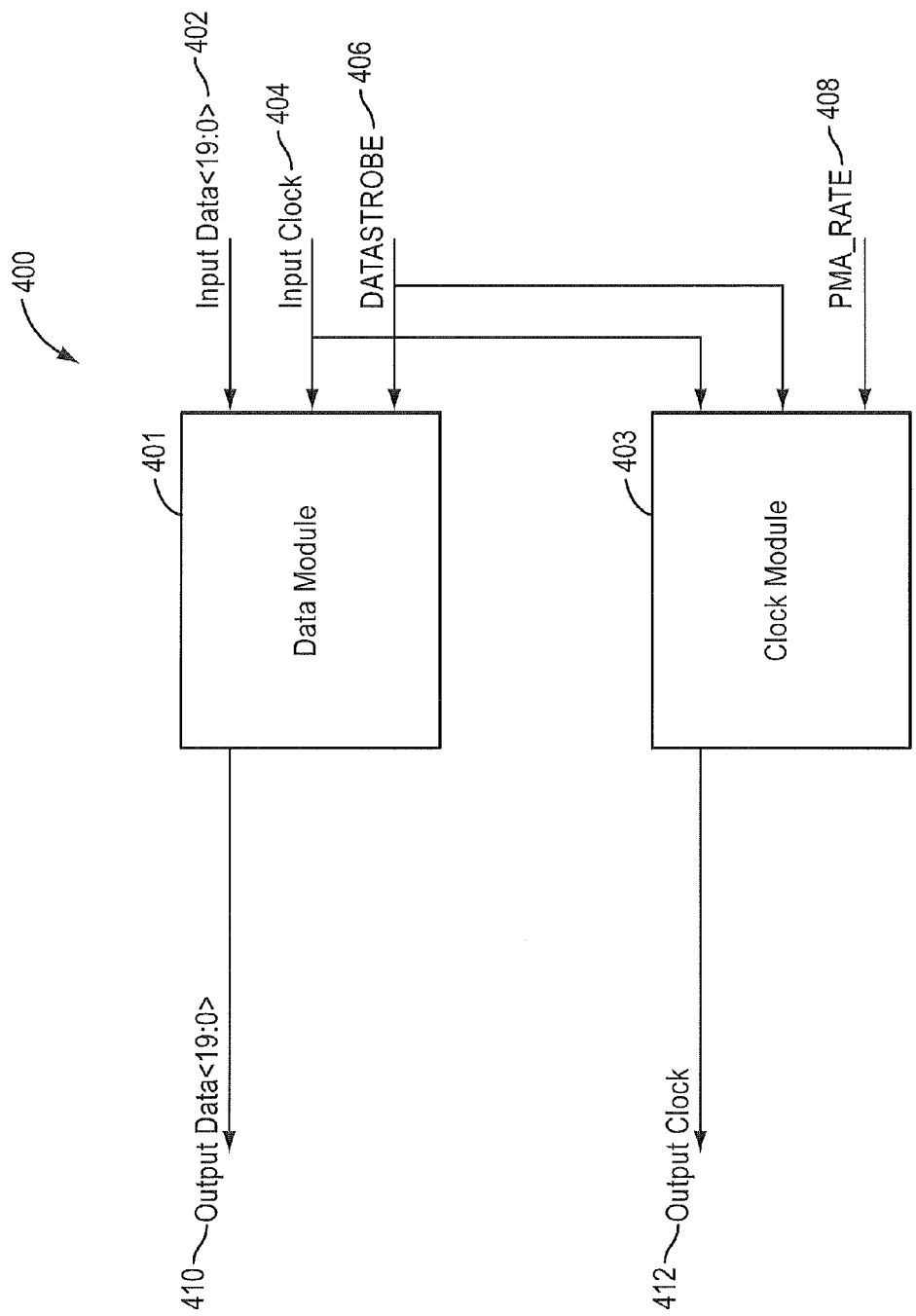
FIGS. 4(a)-(b) shows a SERDES according to some embodiments of the present invention.

FIG. 4(a) shows circuit 400 in which the present invention may be practiced. Circuit 400 may be capable matching the input clock signal frequency with the input data signal frequency. Accordingly, circuit 400 may be used to accept as an input a clock signal having one frequency and outputting a clock signal having a variable frequency. For example, circuit 400 may accept an input clock signal with a frequency corresponding to one generation of SERDES while outputting a clock signal having either the same frequency of the input clock signal or a slower frequency of a previous generation of SERDES. Circuit 400 may also accept an input data signal having a variable frequency. For example, circuit 400 may accept an input data signal from multiple generations of SERDES circuit in which each generation of SERDES has a different data signal frequency. Circuit 400 may output a data signal having the same frequency as the frequency of the input data signal. Circuit 400 may be placed at interface 152a shown in FIG. 1(c). Circuit 400 may accept one or more input signals from serial lines 110 and output one or more signals to SERDES 160 as serial data.

Exemplary circuit 400 may include data module 401 and clock module 403. Exemplary circuit 400 may accept as inputs connections for datastrobe 406, input clock 404, input data 402, and PMA Rate 408. Exemplary circuit 400 may transmit signals for output data and output clock on connections 410 and 412, respectively. The signal on output clock connection 412 may have one frequency when PMA rate 408 signal is high and another frequency when PMA rate 408 signal is low. For example, when the signal on PMA rate link 408 signal is low, the signal on output clock link 412 may have a frequency of $$\frac{1}{2T}$$

Hz, corresponding to the frequency for a first generation SERDES. When the signal on PMA rate line 408 is high, however, the signal on output clock connection 412 may have a frequency of 1/T Hz, corresponding to the frequency for a second or later generation SERDES. Further, one bit of data may be transmitted on the link for output data 410 for each period of the output clock on link 412. Accordingly, when the signal for the output clock on link 412 has a period of T, one data bit may also be transmitted on the link for output data 410 during time T. Likewise, when the signal for the output clock on connection 412 has a period of 2T, one data bit may be transmitted on the link for output data 410 during time 2T. Accordingly, in some embodiments, the data transmission rate on the link for output data 410 may be a function of the clock rate for output clock connection 412.

Figure 4B:
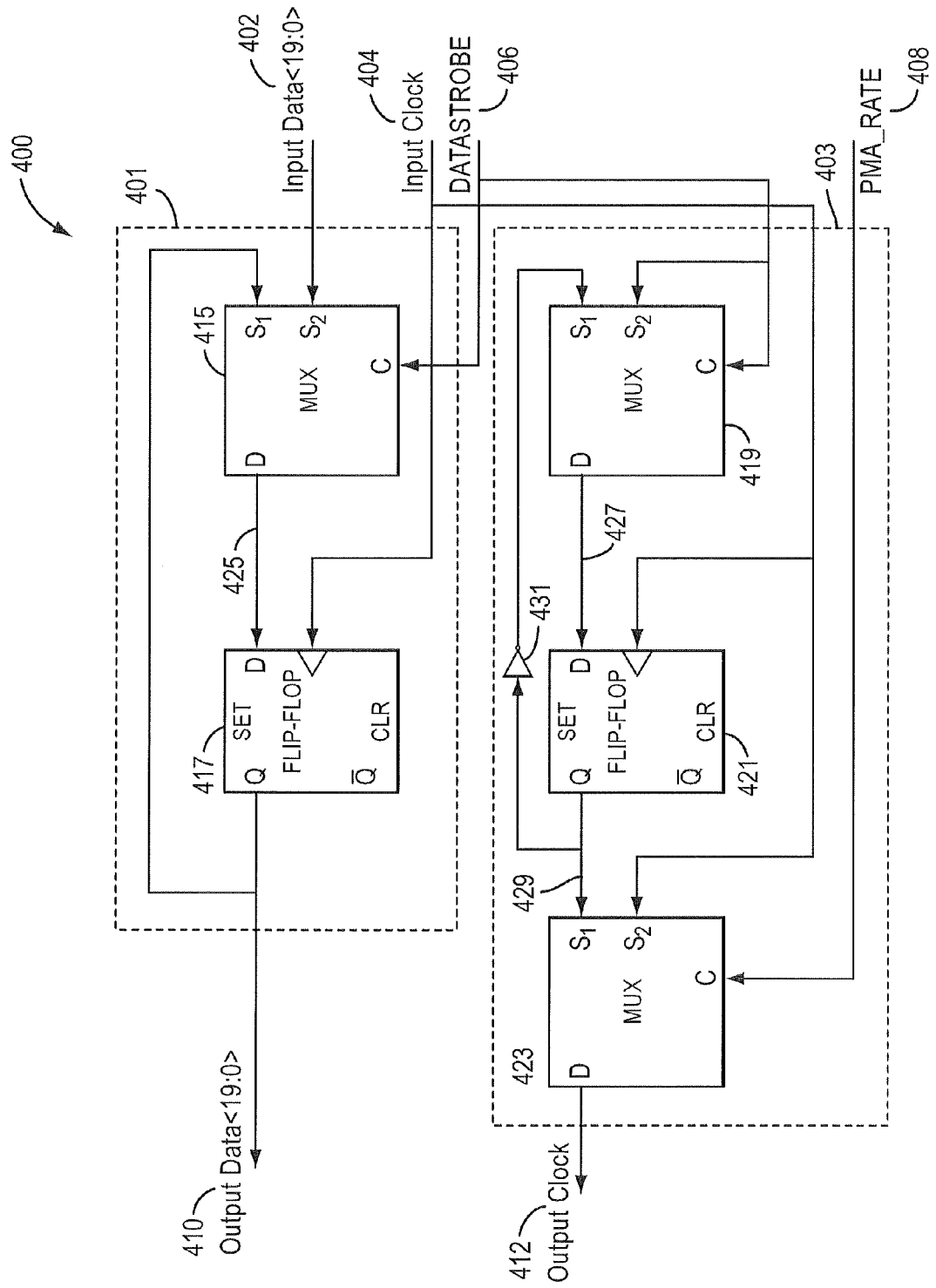

FIG. 4(b) shows circuit 400 according to some embodiments of the present invention. As shown in FIG. 4(b), circuit 400 may include data module 401 and clock module 403. Exemplary circuit 400 may accept as inputs connections or lines for input data 402, input clock 404, datastrobe 406, and PMA rate 408. Exemplary circuit 400 may transmit signals on output data connection 410 and output clock connection 412.

As shown in exemplary circuit 400 in FIG. 4(b), data module 401 may include multiplexer 415 and flip flop 417. Multiplexer 415 may be coupled to flip flop 417 by line 425. The output signal from flip flop 417 may be fed back to multiplexer 415 as an input. Multiplexer 415 may also include input data connection 402 as an input. Datastrobe connection 406 may act as a control for multiplexer 415 to determine which of the two inputs that multiplexer 415 may output onto line 425. For example, when the signal on datastrobe connection 406 is high, multiplexer 415 may output the signal from port $S_2$ onto line 425. As shown in FIG. 4(b), multiplexer 415 may output the signal from input data connection 402 onto line 425 when the signal on datastrobe line 406 is high. Further, when the signal on datastrobe line 406 is low, multiplexer 415 may output the signal from port $S_1$ onto line 425. Thus, when datastrobe 406 is low, multiplexer 415 may output the feedback signal from flip flop 417 onto line 425.

Flip flop 417 may accept the output signal from multiplexer 415 as an input signal and produce an output signal on connection 410. The signal on output data link 410 may also be fed back into multiplexer 415. Further, the signal on input clock connection 404 may be used to latch data into flip flop 417. In some embodiments, data may be latched into flip flop 417 when the signal on input clock connection 404 has a rising edge. After a signal is latched, flip flop 417 may continue to transmit the signal onto output data connection 410 until a new signal is latched on the subsequent rising edge of the input clock signal on line 404.

Clock module 403 may include multiplexer 419, flip flop 421, multiplexer 423, and inverter 431. Multiplexer 419 may be coupled to flip flop 421, the output of which may be fed back through inverter 431 as an input to multiplexer 419. For example, as shown in exemplary circuit 400, the output of flip flop 421 is fed back into port $S_1$ of multiplexer 419. Multiplexer 419 may also accept as an input datastrobe connection 406, which may be fed into port $S_2$. Multiplexer 419 may output a signal onto line 427. The signal on datastrobe connection 406 may also be used to control the output of multiplexer 419. For example, when the signal on datastrobe connection 406 is high, multiplexer 419 may output the signal from port $S_2$ onto line 427. In some embodiments, datastrobe connection 406 may also be input into port $S_2$ of multiplexer 419. Thus, multiplexer 419 may output the high signal from datastrobe connection 406 onto line 427. Further, when the signal on datastrobe connection 406 is low, multiplexer 419 may output the signal from inverter 431 onto line 427.

Flip flop 421 may accept line 427 as an input and output a signal onto line 429. Line 429 may be fed into inverter 431, the output of which may then be fed back into port $S_1$ of multiplexer 419. Line 429 may be fed into port $S_1$ of multiplexer 423. Thus, flip flop 421 may be coupled to multiplexer 423 and inverter 431. Further, the signal from input clock line 404 may be used to latch data into flip flop 421. For example, a signal may be latched-into flip flop 421 on each rising edge of the input clock on line 404. Flip flop 421 may output the latched data until a subsequent rising edge of the input clock on line 404 causes a subsequent signal to be latched into flip flop 421. Flip flop 421 may then output this new signal onto line 429 after the new signal is latched. In some embodiments, multiplexer 419 may be absent. Instead, flip flop 421 may accept the signal from datastrobe connection 406 directly as an input signal. In this case, inverter 431 may also be deleted. The connections to the remaining components, however, may remain the same in the absence of multiplexer 419.

Multiplexer 423 may accept two input signals. One input signal may be the signal output from flip flop 421 onto line 429; the second input signal to multiplexer 423 may be the input clock signal on line 404. As shown in exemplary circuit 400, the signal output from flip flop 421 may be input through port $S_1$. The signal on input clock connection 404 may be input through port $S_2$. Multiplexer 423 may output a signal for the output clock on link 412. The signal on PMA rate connection 408 may be used to control the output of multiplexer 423. For example, when the signal on PMA rate connection 408 is high, multiplexer 423 may output the signal input into port $S_2$. For example, when the signal on PMA rate connection 408 is high, multiplexer 423 may output onto line 412 the signal from input data connection 404. By contrast, when the signal on PMA rate link 408 is low, multiplexer 423 may output onto output clock connection 412 the signal received from flip flop 421 on line 429 through port $S_1$.

Figure 4C:
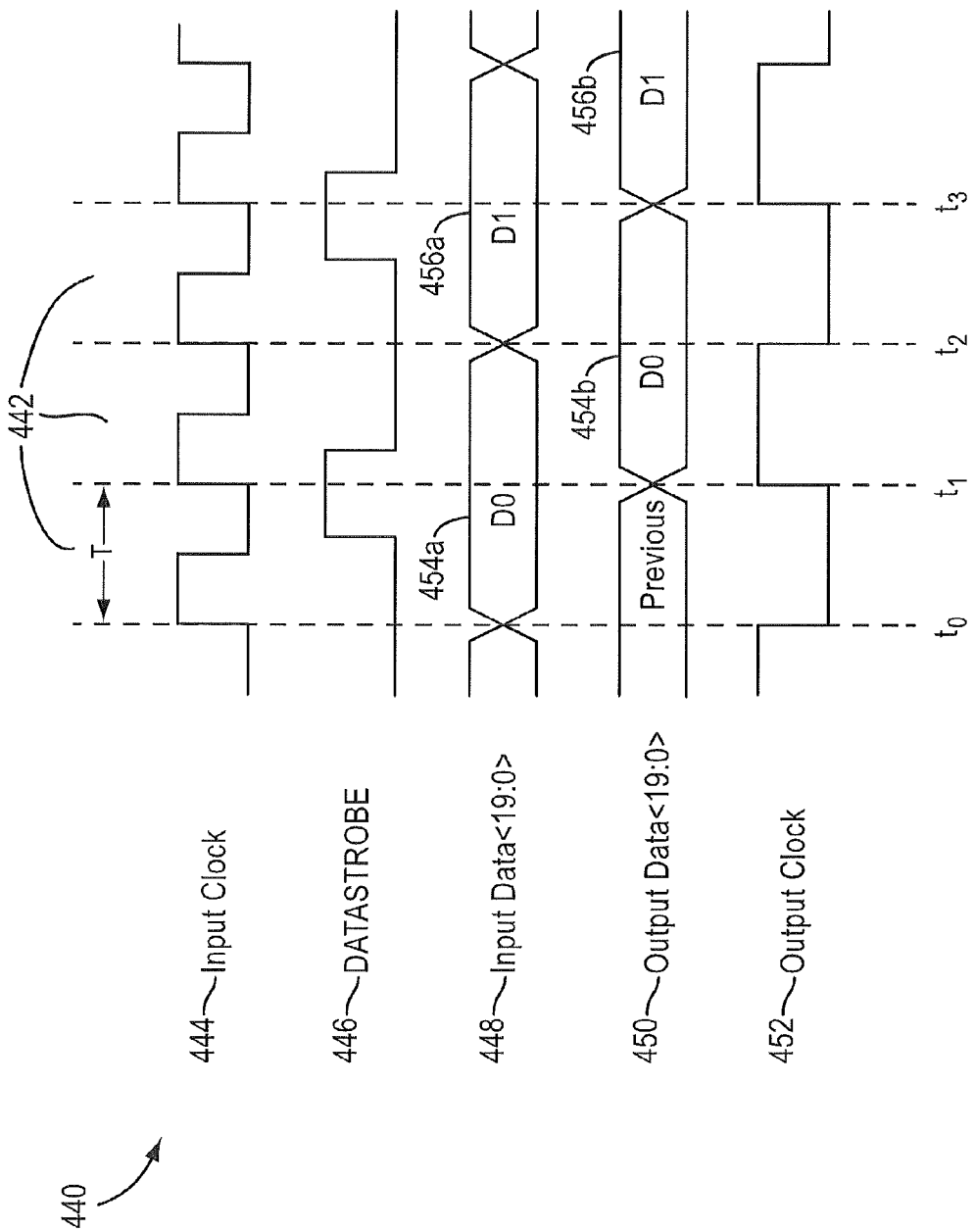
FIGS. 4(c)-(d) show timing diagrams of the embodiment illustrated in FIGS. 4(a) and (b).
Figure 4D:
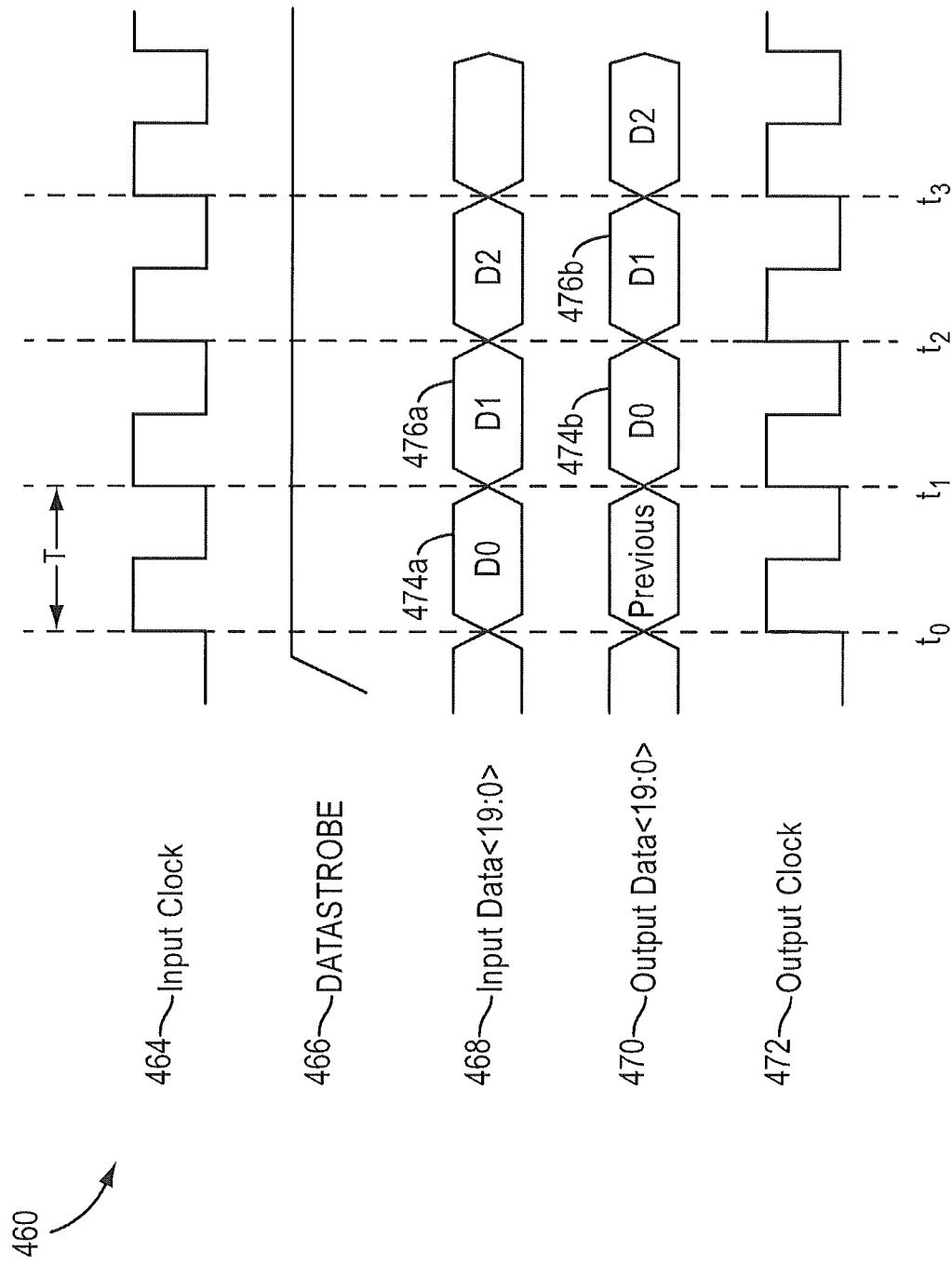

FIGS. 4(c)-(d) show exemplary timing diagrams of the exemplary circuits FIGS. 4(a)-(b). Timing diagram 440 in FIG. 4(c) includes signals for input clock 444, datastrobe 446, input data 448, output data 450, and output clock 452. Further, timing diagram 440 shows input clock 444 with a period of T while output clock 452 has a period of 2T. Each bit of data for input data 448 and output data 450 may be transmitted over two periods of input clock 444. For example, data bit 454a, which contains the value D0, may be transmitted from time $t_0$ to time $t_2$. Likewise, data bit 454b, which also contains the value D0, may be transmitted from time $t_1$ to time $t_3$.

Similarly, timing diagram 460 in FIG. 4(d) includes signals for input clock 464, datastrobe 466, input data 468, output data 470, and output clock 472. Further, timing diagram 460 shows input clock 464 with a period of T while output clock 462 also has a period of T. Each data bit for input data 468 and output data 470 may be transmitted during one period of input clock 464. For example, data bit 474a, which contains the value D0, may be transmitted from time $t_0$ to time $t_1$. Likewise, data bit 474b, which also contains the value D0, may be transmitted from time $t_1$ to time $t_2$. In timing diagram 460, however, datastrobe signal 466 remains a constant high.

The signal on datastrobe line 406 may be used to determine the frequency at which data is transmitted. As shown in timing diagram 440 in FIG. 4(c), at time $t_0$, input data signal 448 transmits the value for bit D0. Signal 446 on datastrobe line 406, however, is low at time $t_0$ so that multiplexer 415 outputs onto line 425 the signal from port $S_1$, in this case, the previous output from flip flop 417. Because the input clock signal on line 404 has a rising edge at time $t_0$, flip flop 417 may latch this previous value and continue to output onto line 410 as output data 450.

Referring still to timing diagram 440 in FIG. 4(c) and circuit 400, at time $t_1$, input data signal 448 continues to transmit the value for bit D0. Datastrobe signal 446, however, is high at time $t_1$, so that multiplexer 415 outputs the signal from port $S_2$, in this case, the value for D0, onto line 425. Further, at time $t_1$, signal 444 on input clock line 404 has a rising edge so that latch 417 latches the value of D0 present on line 425 into flip flop 417 and outputs this value as output data 450 on line 410. Flip flop 417 also inputs the value of D0 into port $S_1$ on multiplexer 415 at this time.

As seen in timing diagram 440 in FIG. 4(c), datastrobe signal 446 may be low at time $t_2$, so that multiplexer 415 may output onto line 425 the value of D0 that is input into port $S_1$. The value of D0 on line 425 may be latched into flip flop 417 at time $t_2$, which is a rising edge for input clock signal 444. Flip flop 417 may also output the signal for D0 as output data signal 450 on line 410. Thus, even though input data signal 448 may change at time $t_2$, the value of output data signal 450 may not change at this time.

Finally, as seen in timing diagram 440 in FIG. 4(c), datastrobe signal 446 may be high at time $t_3$, causing multiplexer 415 to output the signal present at port $S_2$, in this case input data signal 448 on line 402. As seen in timing diagram 440, input data signal 448 on line 402 at time $t_2$ has the value D1. Because the input clock signal on line 404 has a rising edge at time $t_2$, flip flop 417 may latch this value D1 and output it as output data signal 450 on line 410. Accordingly, output data signal 450 on line 410 at time $t_2$ may equal the value D1. Thus, as shown in timing diagram 440 in FIG. 4(c), the value for output data signal 450 may lag the value for input data signal 448 by a period T. Further, datastrobe signal 446 pulses at a frequency of $$\frac{1}{2T}$$

Hz, the period for output data signal 450 may be 2T seconds.

As seen in timing diagram 460 of FIG. 4(d), datastrobe signal 466 may cause the frequency of output data signal to be the same as the frequency of input clock signal 464. For example, as shown in timing diagram 460, this frequency may be 1/T Hz. Referring now to circuit 400 and timing diagram 460, when signal 466 on datastrobe line 406 is continuously high, multiplexer 415 may continue to output the signal from port $S_2$ onto line 425. As shown in exemplary circuit 400, input data connection 402 may be input into port $S_2$. Multiplexer 415 may still be transmitting the value of the previous data bit onto line 425 at time $t_0$. Further, flip flop 417 may latch the value on line 425 for each rising edge of the signal on input clock connection 404. Thus, at time $t_0$, multiplexer 415 outputs the signal for the previous data bit onto line 425. Because input clock signal 464 has a rising edge at time $t_0$, flip flop 417 latches this value and outputs it as output data signal 470 on line 410.

At time $t_1$, as shown in circuit 400 and timing diagram 460 in FIG. 4(d), multiplexer 415 may output onto line 425 the signal at port $S_2$, in this case, the value D0 from input data signal 468. Because input clock signal 464 has a rising edge at time $t_1$, flip flop 417 latches the value for D0 present at port $S_2$ and outputs this value as output data signal 470 on line 410. This same process continues for subsequent rising edges of input clock 404.

The signal for PMA rate 408 may be used to determine the frequency for the signal on output clock link 412. Timing diagram 440 in FIG. 4(c) may correspond to a timing diagram when the signal on PMA rate connection 408 is low. As shown in timing diagram 440, the frequency of output clock signal 452 may be less than the frequency of input clock signal 444. For example, the frequency of output clock signal 452 may be half that of input clock signal 444.

Referring to timing diagram 440 in FIG. 4(c) and circuit 400, at time t₀, datastrobe signal 446 is low, so that multiplexer 419 may output the value from port S₁ onto line 427. If the output from flip flop 421 had been high in the previous time period, then inverter 431 would input a low signal into port S₁ at time t₀. Accordingly, multiplexer 419 may output onto line 427 the low signal present at port S₁. Because input clock signal 444 has a rising edge at time t₀, flip flop 421 may latch this low value and output it onto line 429. As PMA rate 408 is low, multiplexer 423 outputs the low signal from line 429 and input into port S₁ as output clock signal 452 on line 412.

At time t₁ in timing diagram 440 in FIG. 4(c), datastrobe signal 446 is high, so that multiplexer 419 outputs the signal from port S₂. As shown in circuit 400, datastrobe signal 446 may be input into port S₂ so that a high signal is output by multiplexer 419 onto line 427. As input clock signal 444 has a rising edge at time t₁, flip flop 421 may latch the high value present on line 427 and output this high value onto line 429. Because PMA rate 408 is low, multiplexer 423 may output this high signal present at port S₁ as output clock signal 452 on line 412.

At time t₂, datastrobe signal 446 cycles back to low. In response multiplexer 419 may output the signal fed into port S₁. Because the output signal from flip flop 421 on line 429 is high at time t₂, inverter 431 feeds into port S₁ a low signal, which multiplexer 419 then may output onto line 427. Input clock signal 444 has a rising edge at time t₂. As a result, flip flop 421 may latch the low signal on line 427 and output this low signal onto line 429, which may feed into port S₁ of multiplexer 423. Finally, because PMA rate 408 is low, multiplexer 423 outputs the low value from port S₁ as output clock signal 452 on line 412.

At time t₃ in timing diagram 440 in FIG. 4(c), datastrobe signal 446 returns to high, so that multiplexer 419 outputs the signal from port S₂. As shown in circuit 400, datastrobe signal 446 may be input into port S₂ so that a high signal is output by multiplexer 419 onto line 427. As input clock signal 444 has a rising edge at time t₃, flip flop 421 latches the high value on line 427 and outputs this high value onto line 429. Finally, because the signal on PMA rate connection 408 is low, multiplexer 423 outputs this high value as output clock 452 on line 412. Thus, when the signal on PMA rate link 408 is low, the frequency of output clock signal 452 may be $$\frac{1}{2T}$$

Hz while the frequency of input clock signal 444 may be 1/T Hz.

Timing diagram 460 in FIG. 4(d) may correspond to a timing diagram when the signal on PMA rate connection 408 is high. As shown in timing diagram 460, the frequency of output clock signal 472 may equal the frequency of input clock signal 464. For example, the frequency of both output clock signal 472 and input clock signal 464 may be 1/T Hz.

As shown in exemplary circuit 400, when the signal on PMA rate signal line 408 is high, multiplexer 423 outputs the signal from port S₂. Further, the signal on input clock line 404 may be input to port S₂ of multiplexer 423. Accordingly, as seen in timing diagram 460, output clock signal 472 may be identical to input clock signal 464. Thus, the signal on output clock connection 412 may have a period of 1/T Hz when the signal on PMA rate connection 408 is high while the signal on output clock connection 412 may have a period of $$\frac{1}{2T}$$

Hz when the signal on PMA rate line 408 is low.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A circuit for providing a variable data transmission rate, the circuit comprising:
    a clock module receiving inputs of a data strobe signal, an input clock signal, and an input physical medium attachment (PMA) rate signal, and
    a data module receiving inputs of the data strobe signal, the input clock signal, and an input serializer-deserializer (SERDES) data signal,
    the clock module outputting an output clock signal, the output clock signal having a first frequency when the PMA rate signal is set high and a second frequency when the PMA rate signal is set low, and
    the data module outputting an output SERDES data signal as a function of the data strobe signal.

2. The circuit of claim 1 wherein the data module includes a data module multiplexer coupled to a data module flip flop,
    the data module multiplexer accepting inputs of the data strobe signal and the input SERDES data signal, and outputting an intermediate data signal as a function of the data strobe signal, and
    the data module flip flop accepting inputs of the intermediate data signal and the input clock signal, and outputting the output SERDES data signal.

3. The circuit of claim 1 wherein the output SERDES data signal changes on a rising edge of the input clock signal when the data strobe signal is high.

4. The circuit of claim 1 wherein the clock module includes a first clock module multiplexer, a clock module flip flop, and a second clock module multiplexer,
    wherein the first clock module multiplexer is coupled to the clock module flip flop,
    wherein the clock module flip flop is coupled to the second clock module multiplexer and the first clock module multiplexer, and
    wherein the second clock module multiplexer outputs the output clock signal.

5. The circuit of claim 4 wherein the second clock module multiplexer accepts an input of the PMA rate signal and outputs the output clock signal as a function of the PMA rate signal.

6. The circuit of claim 4 wherein an input for the clock module flip flop is latched as a function of the input clock signal.

7. The circuit of claim 1 wherein the first frequency of the output clock signal is at least twice the second frequency of the output clock signal.

8. The circuit of claim 1 wherein the circuit is implemented as part of a SERDES circuit.

9. A method for providing a variable data transmission rate, the method including:
    inputting a data strobe signal, an input clock signal, and an input physical medium attachment (PMA) rate signal to a clock module, inputting the data strobe signal, the input clock signal, and an input serializer-deserializer (SERDES) data signal to a data module, outputting an output clock signal from the clock module, the output clock signal having a first frequency when the PMA rate signal is set high and a second frequency when the PMA rate signal is set low, and outputting an output SERDES data signal from the data module as a function of the data strobe signal.

10. The method of claim 9 wherein inputting the data strobe signal, the input clock signal, and the input SERDES data signal to the data module includes inputting the data strobe signal and the input SERDES data signal to a data module multiplexer in the data module, outputting an intermediate data signal from the data module multiplexer, inputting the intermediate data signal and the input clock signal to a data module flip flop, and outputting the output SERDES data signal from the data module flip flop.

11. The method of claim 9 further including changing the output SERDES data signal on a rising edge of the input clock signal when the data strobe signal is high.

12. The method of claim 9 wherein inputting the data strobe signal, the input clock signal, and the input PMA rate signal to the clock module includes inputting the PMA rate signal to a clock module multiplexer and outputting the output clock signal from the clock module multiplexer as a function of the PMA rate signal.

13. The method of claim 9 wherein the first frequency of the output clock signal is at least twice the second frequency of the output clock signal.

* * * * *